United States Patent
Gajanayake et al.

(10) Patent No.: US 9,964,600 B2
(45) Date of Patent: May 8, 2018

(54) OPEN SWITCH FAULT DETECTION AND IDENTIFICATION IN A TWO-LEVEL VOLTAGE SOURCE POWER CONVERTER

(71) Applicant: ROLLS-ROYCE plc, London (GB)

(72) Inventors: Chandana Jayampathi Gajanayake, Singapore (SG); Shantha Dharmasiri Gamini Jayasinghe, Singapore (SG); Sivakumar Nadarajan, Singapore (SG); Amit Kumar Gupta, Singapore (SG)

(73) Assignee: ROLLS-ROYCE PLC, London (GB)

( * ) Notice: Subject to any disclaimer, the term of this patent is extended or adjusted under 35 U.S.C. 154(b) by 211 days.

(21) Appl. No.: 14/991,139

(22) Filed: Jan. 8, 2016

(65) Prior Publication Data
US 2016/0216332 A1    Jul. 28, 2016

(30) Foreign Application Priority Data
Jan. 26, 2015   (GB) .................................. 1501205.7

(51) Int. Cl.
   *G01R 31/02*   (2006.01)
   *G01R 31/42*   (2006.01)

(52) U.S. Cl.
   CPC .................................... *G01R 31/42* (2013.01)

(58) Field of Classification Search
   CPC .......................... G01R 31/3271; G01R 31/333
   See application file for complete search history.

(56) References Cited

U.S. PATENT DOCUMENTS

| | | | | |
|---|---|---|---|---|
| 5,341,145 A | * | 8/1994 | Eckersten | G01S 13/4418 342/148 |
| 8,773,077 B1 | * | 7/2014 | Elmes | H02J 7/0072 320/128 |
| 9,529,032 B2 | * | 12/2016 | Wolbank | G01R 31/343 |
| 2001/0004322 A1 | * | 6/2001 | Kurokami | H02M 7/53873 363/56.03 |
| 2005/0057212 A1 | * | 3/2005 | Harbaugh | H02P 21/22 318/809 |
| 2005/0255963 A1 | * | 11/2005 | Hsieh | B60W 10/06 477/3 |
| 2006/0197491 A1 | * | 9/2006 | Nojima | H02M 7/487 318/801 |

(Continued)

FOREIGN PATENT DOCUMENTS

| | | |
|---|---|---|
| EP | 2393198 A2 | 12/2011 |
| EP | 2881811 A1 | 6/2015 |

(Continued)

OTHER PUBLICATIONS

Aug. 13, 2015 Search Report issued in European Patent Application No. 1501205.7.

*Primary Examiner* — Tung X Nguyen
*Assistant Examiner* — Dominic Hawkins
(74) *Attorney, Agent, or Firm* — Oliff PLC

(57) ABSTRACT

A method of open-switch fault detection in a two-level voltage source power converter comprises the steps of:
i. acquiring the waveforms of three-phase alternating current of the two-level voltage source power converter;
ii. calculating at least a first time derivative of each acquired waveform; and
iii. using the at least first time derivatives to determine whether an open-switch fault is present in the two-level voltage source power converter.

15 Claims, 8 Drawing Sheets

(56) References Cited

U.S. PATENT DOCUMENTS

| | | | |
|---|---|---|---|
| 2009/0132180 A1* | 5/2009 | Pearce | F02D 41/20 702/38 |
| 2009/0302792 A1* | 12/2009 | Osada | H02P 29/032 318/400.21 |
| 2012/0200966 A1* | 8/2012 | Hill | G01R 31/024 361/62 |
| 2013/0054043 A1* | 2/2013 | Klodowski | G01R 31/343 700/293 |
| 2013/0257334 A1* | 10/2013 | Dalton | H02P 27/04 318/504 |

FOREIGN PATENT DOCUMENTS

| | | |
|---|---|---|
| JP | 2010-283986 A | 12/2010 |
| JP | 2011-211839 A | 10/2011 |

\* cited by examiner

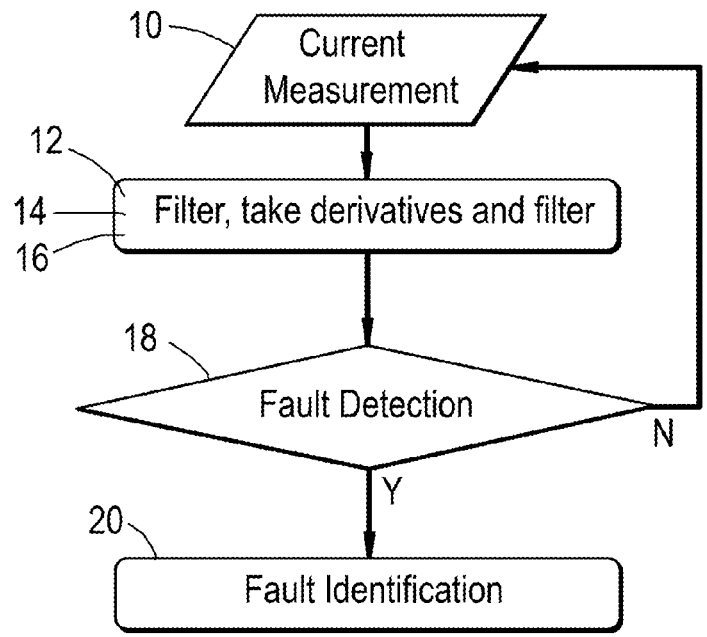
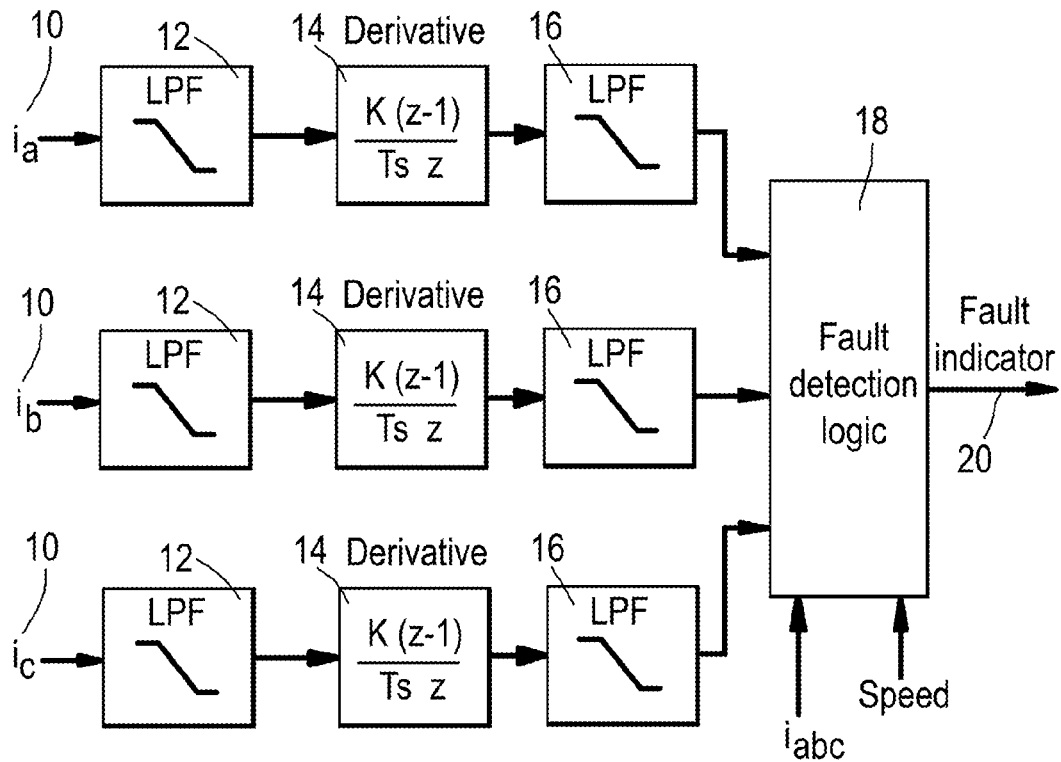

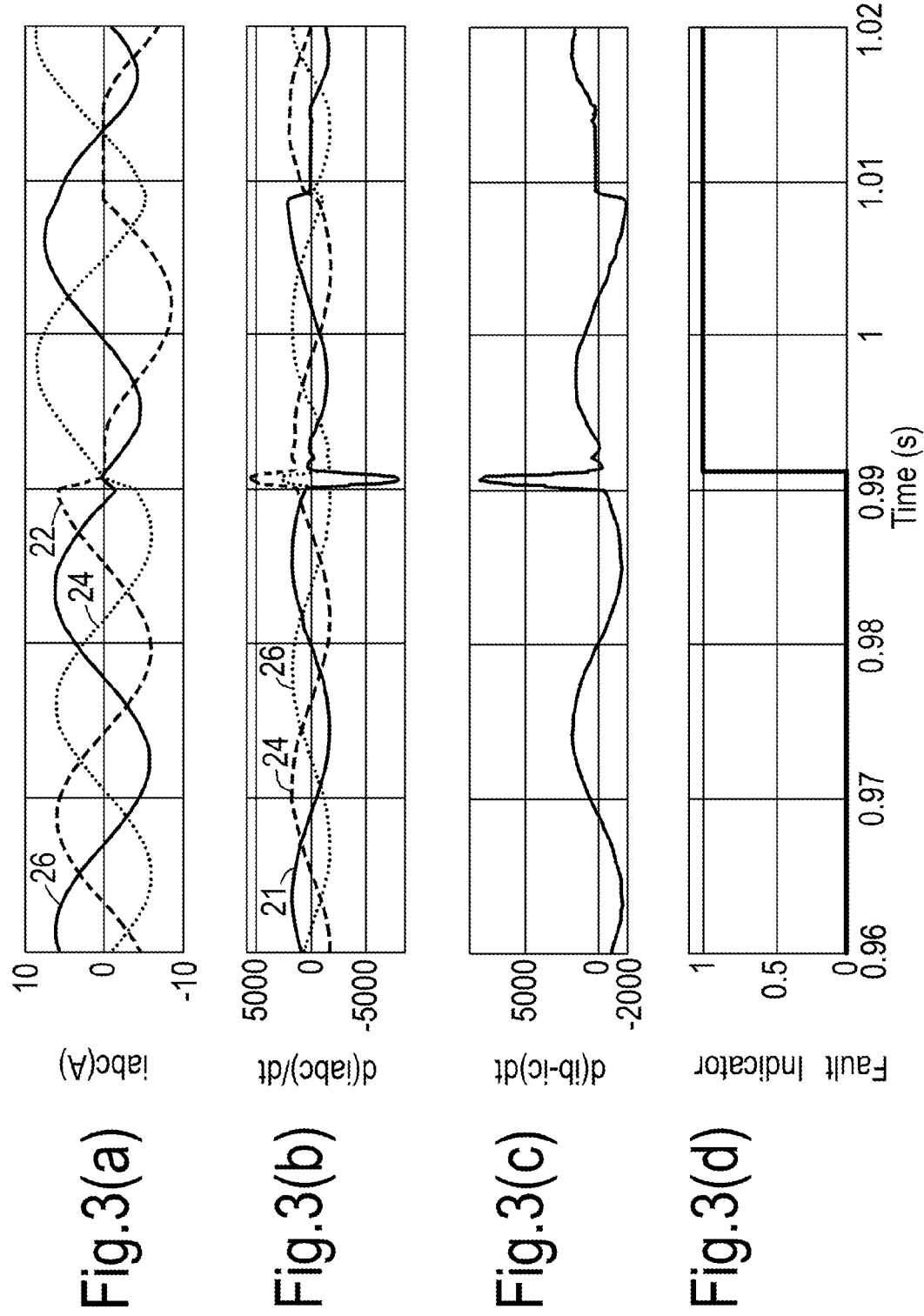

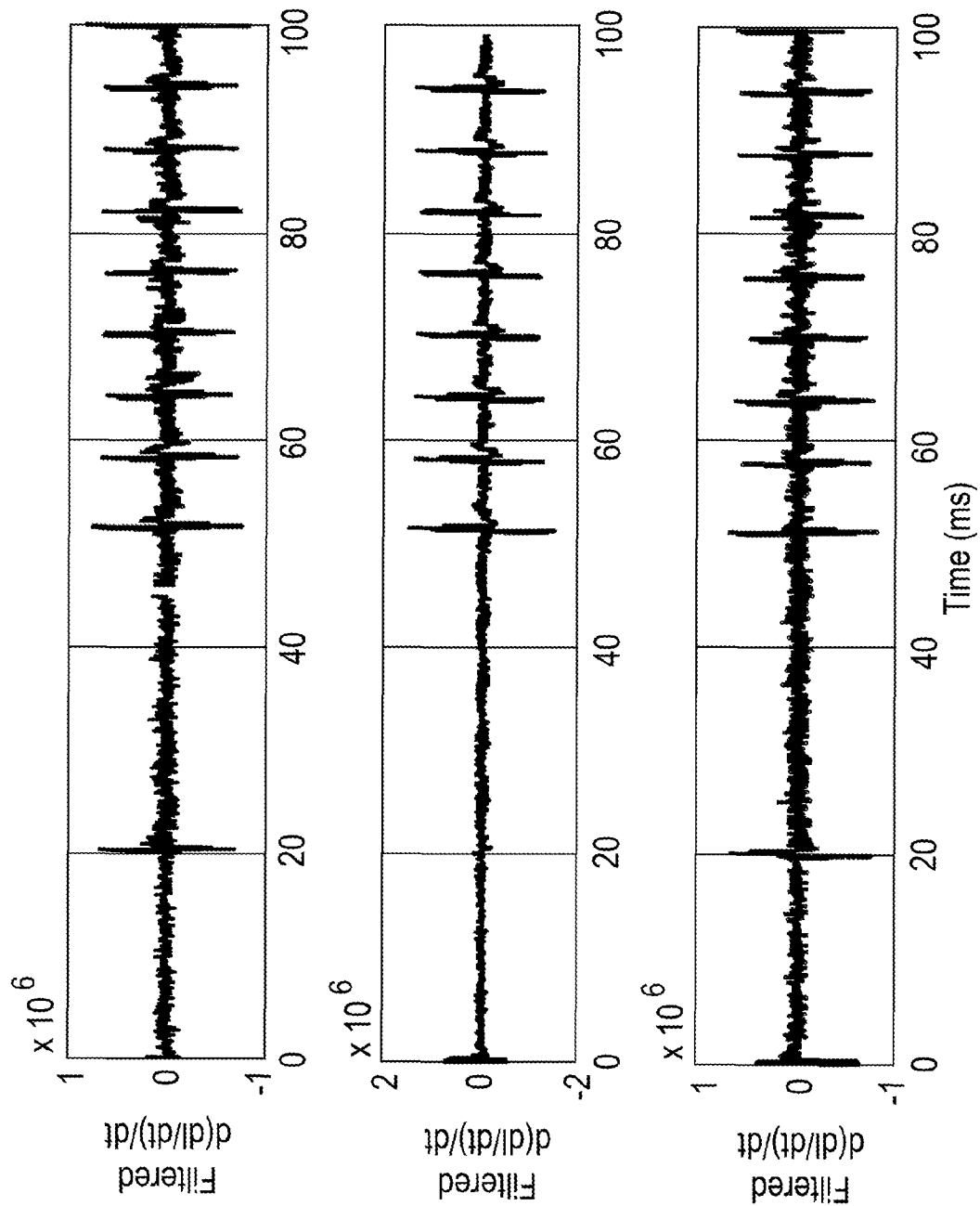

US 9,964,600 B2

OPEN SWITCH FAULT DETECTION AND IDENTIFICATION IN A TWO-LEVEL VOLTAGE SOURCE POWER CONVERTER

This disclosure claims the benefit of UK Patent Application No. GB1501205.7, filed on 26 Jan. 2015, which is hereby incorporated herein in its entirety.

FIELD OF THE DISCLOSURE

The present disclosure relates to two-level voltage source power converters, and in particular to methods for open switch fault detection and identification in a two-level voltage source power converter.

BACKGROUND OF THE DISCLOSURE

Power inverters are widely utilised to convert DC (direct current) power to AC (alternating current) power for applications requiring a time dependent power input. There are two generally well-known types of power inverter, namely current source inverters and voltage source inverters. Current source inverters have a predetermined load current, with the load impedance determining the output voltage, whereas voltage source inverters specify the load voltage, with the drawn current being dictated by the load.

In an example of a basic power inverter, a DC power source is connected to a transformer through the centre tap of the primary winding. A switch is used to rapidly alter the path of current flowing back to the DC power source, such that the current flows back to the DC source via two alternate paths, firstly through one end of the primary winding, and secondly through the other end of the primary winding. This alternation of the direction of current in the primary winding produces an alternating current in a secondary circuit of the transformer.

This basic principle of operation can be extended to output three-phase currents, which are commonly used for variable-frequency drive applications, for example as a power input for an electrical induction motor. A two-level, three phase voltage source inverter typically comprises three sets of two switches (a top switch and a bottom switch), with each set of two switches effectively functioning to produce a phase of the three-phase current that is to be produced.

A common fault in an inverter such as that described above is a so-called "open switch" fault, whereby a fault in the system causes a switch to remain open, thereby preventing the desired form of three-phase current being produced. This can prove to be costly in terms of machine down-time, increased operating costs, and further incurred costs associated with the repair of the open switch fault. It is therefore desirable, where possible, to prevent such open switch faults from occurring, or to quickly diagnose faults such that they may quickly be rectified.

Controlled power rectifiers operate in a similar manner to convert alternating current (AC power) to direct current (DC power), and thereby suffer from similar open switch faults There has now been devised an improved method of open switch fault detection in a two-level voltage source power converter which overcomes or substantially mitigates the aforementioned and/or other disadvantages associated with the prior art.

BRIEF SUMMARY OF THE DISCLOSURE

According to a first aspect of the present disclosure there is provided a method of open-switch fault detection in a two-level voltage source power converter, the method comprising:

i. acquiring three-phase alternating current waveforms of the two-level voltage source power converter;
ii. calculating at least a first time derivative of each acquired waveform; and
iii. using the calculated at least first time derivatives to determine whether an open-switch fault is present in the two-level voltage source power converter.

Each of (i), (ii) and (iii) may be performed as steps, for example in a sequence according the order defined above.

The method of the first aspect of the present disclosure is advantageous, principally as the use of time derivatives of the waveforms of the alternating three-phase current may allow for fault detection based on feature extraction rather than feature comparison. The method of the first aspect of the present disclosure may therefore be immune to load changes, speed changes, and the presence of any harmonics in the phase currents, and may thus be quicker and more robust than known fault detection techniques. Furthermore, the method may allow for open-switch fault detection throughout the full cycle of the three-phase alternating currents.

The power converter may be a two-level voltage source inverter, or may be a two-level voltage source active rectifier. Where the power converter is a two-level voltage source inverter, the three-phase alternating current waveforms may be an output of the inverter. Where the power converter is a two-level voltage source active rectifier, the three-phase alternating current waveforms may be an input of the rectifier.

The presence of an open-switch fault may be determined when the instantaneous value and first time derivative of a waveform of one phase of the three-phase alternating current is zero. Additionally or alternatively, the presence of an open-switch fault may be determined when the sum of the instantaneous values and the sum of first time derivatives of each acquired waveform are equal to zero. Additionally or alternatively, the presence of an open-switch fault may be determined when the instantaneous value of two of the phases of the three-phase alternating current are equal and opposite and first time derivatives of the same two phase currents are equal and opposite in magnitude.

The presence of an open-switch fault may be determined when the first time derivatives of two of the phases of the three-phase alternating current are equal and opposite in magnitude, and the first time derivative of the remaining phase of the three-phase alternating current is zero, and instantaneous value of two of the phases of the three-phase alternating current are equal and opposite.

The presence of an open-switch fault may be determined when the sum of two, e.g. non-zero, first time derivatives of the phases of the three-phase alternating current is zero, and the remaining phase of the three-phase alternating current is zero.

The three-phase output current waveforms of the power converter may be obtained through current sensors which are readily available in power converter systems. The first time derivatives may be calculated by digital controller used to control the power converter. The digital controller may be, for example, a digital signal processor (DSP).

The waveforms may be sinusoidal waveforms, or any other appropriate type/shape of waveform, for example under normal, non-fault conditions.

The method may comprise using the calculated time derivatives to identify a location of the open-switch fault. The location may be a relative location within the switches, for example according to relative position and/or phase angle. Thus the method of the first aspect of the present disclosure may allow for quick and robust fault detection and identification.

The location of the open-switch fault may be determined based on the sum of a plurality of the at least first time derivatives of each acquired waveform. The location of the open-switch fault may be determined according to a first waveform of a three-phase switch array when a sum of the first time derivatives of the further two acquired waveforms in the three-phase array is equal to zero. Additionally or alternatively the location of the open-switch fault may be determined according to a first waveform when the first time derivatives of the remaining two of the phases of the three-phase alternating current are equal and opposite in magnitude.

The location of the open-switch fault may be determined according to the remaining phase when the first time derivatives of two of the phases of the three-phase current are equal and opposite in magnitude, and the first time derivative of the remaining phase of the three-phase alternating current is zero.

The location of the open-switch fault may be determined by the phase angle at which the presence of the open-switch fault is detected.

The method may comprise processing the acquired waveforms. The method may comprise filtering the acquired waveforms. The method may comprise filtering the acquired waveforms prior to calculating the at least first time derivative of each acquired waveform. The method may comprise filtering the acquired waveforms after calculating the at least first time derivative of each acquired waveform.

The acquired waveforms may be filtered using a low-pass filter. The acquired waveforms may be filtered using a band-pass filter. Thus the method may eliminate any unnecessary noise associated with the acquired waveforms.

The presence of an open-switch fault may be determined only when a load driven by the power converter is at a non-zero speed. Thus false fault detection may be prevented.

The method may comprise outputting a signal indicative of an open switch fault. The outputted signal may be a latched signal.

The method may use second time derivatives of each acquired waveform to determine whether an open-switch fault is present in the two-level power converter. The presence of an open-switch fault may or may not be determined based on identified fault signatures in the calculated second time derivatives. The presence of an open-switch fault may or may not be determined based on a magnitude and/or sign of one or more second time derivative of the acquired waveforms. The presence of an open-switch fault may or may not be determined based on a magnitude of one or more second derivative waveform exceeding a threshold value.

The method may or may not comprise using the calculated second time derivatives to identify the location of the open-switch fault. The presence or location of an open-switch fault may be determined based on the sign of at least a portion of the calculated second time derivative of the waveforms or fault signatures thereof. The presence or location of an open-switch fault may be determined when based upon a portion of an identified fault signature in a calculated second time derivative of one phase having a first sign, and at least a corresponding portion of identified fault signatures in the calculated second time derivatives of the remaining phases having a second sign, the second sign being different to the first sign. The portions of the signals may be concurrent.

The method may comprise using one at least first time derivative to identify or locate a fault and using a further time derivative of a different order to confirm the presence or location of the fault.

The method may further comprise an additional open-switch fault detection process to confirm the presence of an open-switch fault. The additional open-switch fault detection process may utilise the q-axis current of the three-phase current. The q-axis current may be obtained via a direct-quadrature-zero transformation. The q-axis current may be obtained via a Park transformation. The q-axis current may be processed. The q-axis current may be filtered. The q-axis current may be filtered using a low pass filter. The q-axis current may be filtered using a band pass filter.

The method of open-switch fault detection according to any example of the disclosure may be repeated where no open-switch fault is present, for example wherein the power converter is operating under healthy or normal conditions.

The at least first time derivative may comprise a first and/or second time derivative. The at least first time derivative may be calculated at a substantially concurrent time and/or in respect of a substantially concurrent time period.

Any of the preferential aspects of the first aspect of the present disclosure may be equally applied to further aspects of the present disclosure, wherever practicable.

According to a second aspect of the present disclosure there is provided a method of open-switch fault detection in a two-level voltage source power converter, the method comprising:
  i. acquiring the waveforms of three-phase alternating current of the two-level voltage source power converter;
  ii. calculating at least the second time derivative of each acquired waveform; and
  iii. using the calculated derivatives to determine whether an open-switch fault is present in the two-level voltage source power converter.

It is recognised that the method and apparatus of the present disclosure may be extended to fault detection in current source power converters, as well as to fault detection in higher level power converters in general.

According to a third aspect of the disclosure, there is provided a fault detector for a two-level voltage source power converter, the fault detector comprising: a signal receiver arranged to receive signals indicative of three-phase alternating current waveforms of the two-level voltage source power converter; and one or more signal/data processor arranged to determine at least a first time derivative of each acquired waveform and use the at least first time derivatives to determine whether an open-switch fault is present in the two-level voltage source power converter.

According to a fourth aspect of the disclosure, there is provided a data carrier comprising machine readable instructions for operation of one or more processor to perform the method of the first or second aspect.

BRIEF DESCRIPTION OF THE DRAWINGS

FIG. 1 is a flow chart of a fault detection and identification method according to a first embodiment of the present disclosure;

FIG. 2 is a block diagram of an example of a system for implementing the fault detection and identification method of FIG. 1;

FIG. 3(a) is an example plot of three-phase current waveforms, with an open-switch fault introduced at t=0.99 seconds;

FIG. 3(b) is a plot of the first derivatives of the three-phase currents of FIG. 3(a);

FIG. 3(c) is a plot of the sum of the first derivatives of the b and c-phases of the three-phase current waveforms of FIG. 3(a);

FIG. 3(d) is a plot of a fault indicator signal corresponding to the open-switch fault of FIG. 3(a)

FIG. 8(a) is an example waveform of the second derivative of a-phase current, when there is an open-switch fault in the b-phase current between t=51 ms and t=52 ms;

FIG. 8(b) is an example waveform of the second derivative of b-phase current, when there is an open-switch fault in the b-phase current between t=51 ms and t=52 ms;

FIG. 8(c) is an example waveform of the second derivative of c-phase current, when there is an open-switch fault in the b-phase current between t=51 ms and t=52 ms;

DETAILED DESCRIPTION OF THE DISCLOSURE

Figure 4:
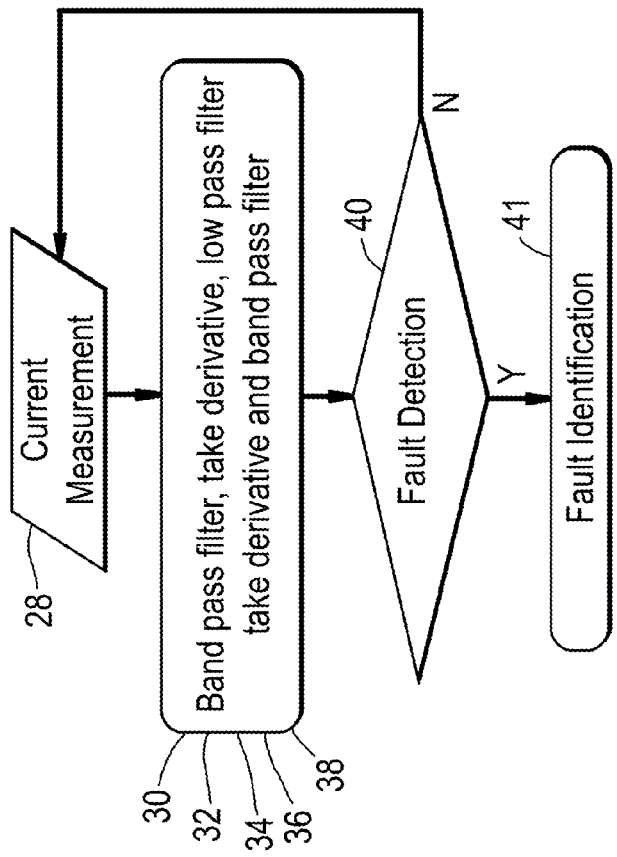
FIG. 4 is a flow chart of a fault detection and identification method according to a second embodiment of the present disclosure.

A first embodiment of the method of fault detection and identification for a two-level voltage source power converter, in this case a two-level voltage source power inverter, attached to a load according to the present disclosure is described with reference to FIGS. 1 and 2.

Initially, each component of the three-phase (denoted phase A, phase B, and phase C) current outputted by the inverter ($I_A$, $I_B$, $I_C$) is measured 10 using current sensors attached to each phase, and is passed through a suitable low-pass filter 12 which has a cut off frequency that is lower than the switching frequency of the inverter. The derivative of each component, $I_A$, $I_B$, and $I_C$, is taken with respect to time 14, and the resulting time-derivatives are passed through a further suitable low-pass filter 16, again having a cut off frequency that is lower than the switching frequency of the inverter to the fault detection module 18. In addition to the time-derivatives, data concerning the initially measured components of the three-phase current, the current phase angle of the reference voltage vector, and the speed of the motor to which the inverter is attached, are also passed to the fault detection module 18.

The fault detection module 18 utilises the following information, to detect and identify an open-switch fault in the inverter.

Under healthy operating conditions, the components of the three-phase current ($I_A$, $I_B$, and $I_C$) outputted by a two-level inverter are such that:

$$I_A + I_B + I_C = 0 \quad (1)$$

When there is an open-switch fault, current in the corresponding phase (in this example phase A) becomes zero either in the positive half cycle or the negative half cycle depending on the fault location. When this occurs, the remaining phase currents are such that:

$$I_B + I_C = 0 \quad (2)$$

Furthermore, the time derivatives of the remaining phase currents are such that:

$$dI_B/dt + dI_C/dt = 0 \quad (3)$$

The fault detection module 18 utilises equations (1), (2), and (3), along with the logic contained in Table 1 below, to detect and identify open-switch faults in the inverter.

TABLE 1

| Phase angle (θ) | Derivative | Condition 2 | Condition 3 | Faulty switch |
|---|---|---|---|---|
| 0 ≤ θ < 180° | $dI_B/dt + dI_C/dt = 0$ | $I_B + I_C \approx 0$ | $|\omega_m| > 0$ | Top switch of the a-phase |
| 180° ≤ θ < 360° | $dI_B/dt + dI_C/dt = 0$ | $I_B + I_C \approx 0$ | $|\omega_m| > 0$ | Bottom switch of the a-phase |
| 120° ≤ θ < 300° | $dI_A/dt + dI_C/dt = 0$ | $I_A + I_C \approx 0$ | $|\omega_m| > 0$ | Top switch of the b-phase |
| 300° ≤ θ < 120° | $dI_A/dt + dI_C/dt = 0$ | $I_A + I_C \approx 0$ | $|\omega_m| > 0$ | Bottom switch of the b-phase |
| 240° ≤ θ < 360° | $dI_B/dt + dI_A/dt = 0$ | $I_B + I_A \approx 0$ | $|\omega_m| > 0$ | Top switch of the c-phase |
| 360° ≤ θ < 240° | $dI_B/dt + dI_A/dt = 0$ | $I_B + I_A \approx 0$ | $|\omega_m| > 0$ | Bottom switch of the c-phase |

As can be seen from the logic table above, when there is an open-switch fault, the current in the phase corresponding to the faulty switch drops to zero, thereby causing the remaining phase currents, and their derivatives, to become equal and opposite. The phase angle at which the fault occurs allows for identification of whether the faulty switch is a top switch or a bottom switch. Furthermore, the condition that the speed of the motor is non-zero avoids false detection of faults when the motor is at zero speed.

The data that is passed to the fault detection module 18 is compared to the data contained in logic Table 1 above, such that any open-switch faults may be detected, and identified.

Whilst a table/database stored on a suitable data store is referred to herein, it will be appreciated that one or more suitable algorithm or routine may be implemented to the same effect. Where no fault is identified, initial current measurements are made again, and the process is repeated. The process may be repeated even in the event of fault detection, e.g. to verify the fault.

Where a fault has been detected, and identified, a digital signal, for example in the form of a visual indicator, is outputted to indicate this information 20. It is presently preferred that the fault indicator is a latched signal, such that once a fault has been indicated it continues to be shown.

Where there are multiple faults present in a single phase, or multiple faults present in different phases, then the fault indicator is set by the first fault that is detected.

Example waveforms of A 22, B 24, and C 24, phase currents are shown in FIG. 3(a), with an open-switch fault in the top of the A-phase introduced at t=0.990 s. As can be seen from FIG. 3(a), when the open-switch fault occurs, the current in the A-phase 22 drops to zero, and the current in the B 24 and C 26 phases becomes equal and opposite. FIG. 3(b) shows the first derivatives of the A 22, B 24, and C 26, phase currents of FIG. 3(a). As can be seen from FIG. 3(b), the first derivative of the A-phase current 22 drops to zero when the open-switch fault occurs, and the first derivatives of the B-phase current 24 and the C-phase current spike, and then become equal and opposite when the first derivative of the A-phase current 22 is zero.

The sum of the first derivatives of the B-phase current 24 and C-phase current 26 shown in FIG. 3(b), is shown in FIG. 3(c). This quantity is zero just after t=0.990 s and during subsequent positive half cycles, thereby validating Equation (3) above. The fault detection logic therefore looks for the condition given in the Equation (3).

Figure 7A:
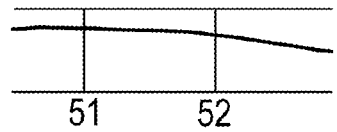
FIGS. 7(a)-7(d) are enlarged views of the region of open-switch fault introduction of FIGS. 6(a)-6(d)
Figure 7B:
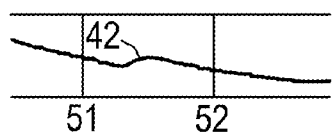
Figure 7C:
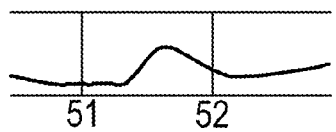
Figure 7D:
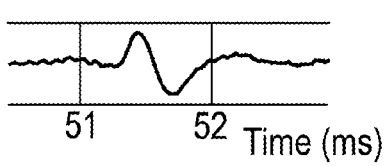

However, as the waveform shown in FIG. 7(c) is periodic, it satisfies the condition in Equation (3) at every zero crossing. Moreover, this zero crossing occurs when both the B-phase current 24 and C-phase current 26 are positive or negative. However, in a faulty condition the B-phase current 24 and C-phase current 26 bear opposite signs. This feature is thus used in the fault detection logic to differentiate zero crossings from a real fault, and both conditions in Equations (2) and (3) should satisfy to assert a faulty condition.

FIG. 3(d) shows a fault indication signal corresponding to FIGS. 3(a)-(c). As seen in FIG. 3(d) the conditions of Equations (2) and (3) get satisfied only after t=0.990 s and therefore the fault indicator signal is non-zero only after t=0.990 s. It should be noted here that the fault indicator is a latched signal, and therefore if a fault is detected it continues to be indicated, as shown in FIG. 3(d).

It is also important to note that the first embodiment of the method of fault detection and identification for a two-level voltage source inverter according to the present disclosure begins only after the transient. Thus the current of a faulty phase has to pass zero first, before fault detection can be started. This makes the first embodiment of the method of the present disclosure immune to transients which may occur in a system operating under healthy conditions.

Figure 5:
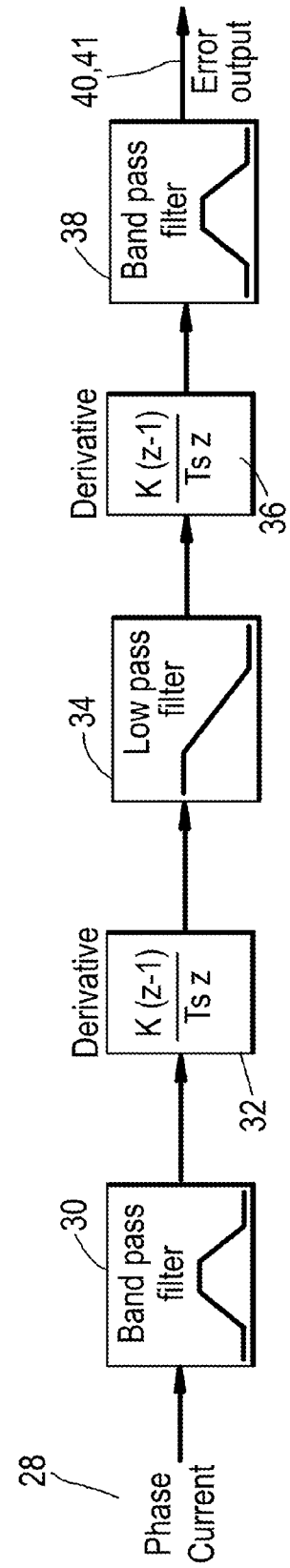
FIG. 5 is a block diagram of an example of a system for implementing the fault detection and identification method of FIG. 3.
Figure 6A:
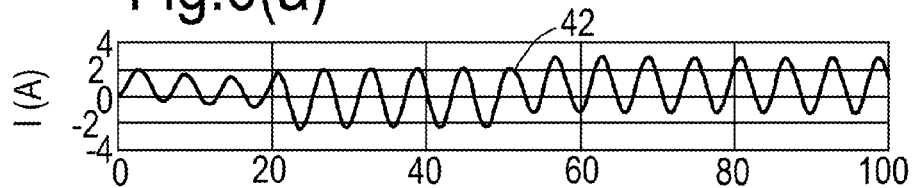
FIG. 6(a) is an example plot of a single-phase current waveform, with an open-switch fault introduced between t=51 ms and t=52 ms.
Figure 6B:
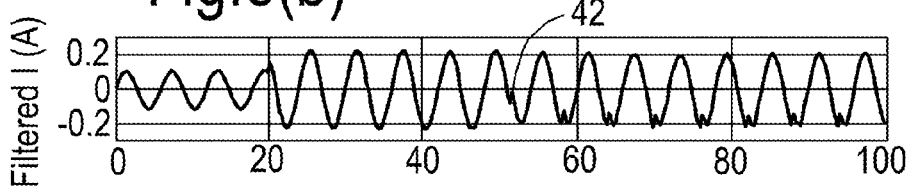
FIG. 6(b) is a plot of a filtered version of the waveform of FIG. 6(a)
Figure 6C:
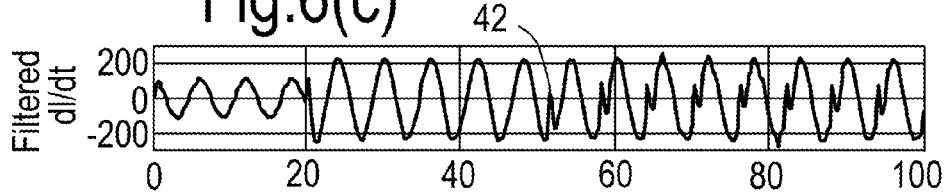
FIG. 6(c) is a plot of the first derivative of the waveform of FIG. 6(b)
Figure 6D:
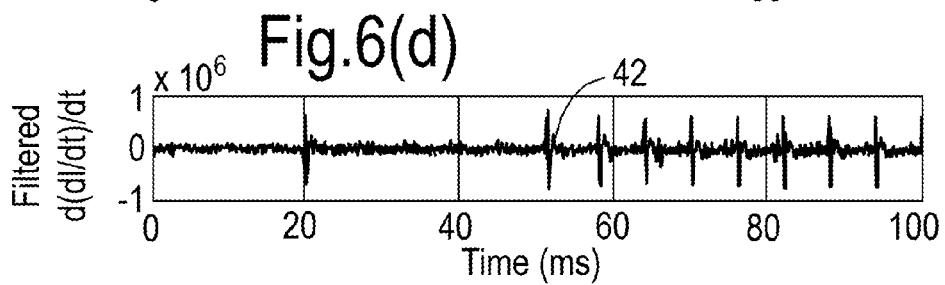
FIG. 6(d) is a plot of the second derivative of the waveform of FIG. 6(b)

A second embodiment of the method of fault detection and identification for a two-level voltage source inverter attached to a load according to the present disclosure is described with reference to FIGS. 4 and 5.

Initially, each component of the three-phase (denoted phase A, phase B, and phase C) current outputted by the inverter ($I_A$, $I_B$, $I_C$) is measured 28 using current sensors attached to each phase, and is passed through a suitable band-pass filter 30 with a cut off frequency lower than the switching frequency of the inverter. The band pass filter 30 has a pass frequency that is a few times higher than the fundamental frequency of the inverter, and the cut off frequency is lower than the switching frequency of the inverter. The derivative of each component, $I_A$, $I_B$, and $I_C$, is taken with respect to time 32, and the resulting time-derivatives are passed through a suitable low-pass filter 34 which has a cut off frequency that is lower than the switching frequency of the inverter. The second time derivative of the filtered signals is taken 36, and the resulting signal is passed through a further band-pass filter 38, to a fault detection 40 and identification 41 module. The band pass filter 38 has a pass frequency that is a few times higher than the fundamental frequency of the inverter, and the cut off frequency is lower than the switching frequency of the inverter.

The fault detection and identification module detects faults based on spikes in the value of the second time derivative of each of the measured three-phase current values. In particular, where spikes occur in the second derivative values of only two phases of the three-phase current, this is indicative of a power reference change. Where spikes occur in the second derivative values of each phase of the three-phase current, then this is indicative of an open switch fault. Open switch faults are characterised by the fault detection and identification module using the logic contained in Table 2 below.

TABLE 2

| $I_A$ | $I_B$ | $I_C$ | Fault |
|---|---|---|---|
| +1 | −1 | −1 | Phase A, top switch |
| −1 | +1 | +1 | Phase A, bottom switch |
| −1 | +1 | −1 | Phase B, top switch |
| +1 | −1 | +1 | Phase B, bottom switch |
| −1 | −1 | +1 | Phase C, top switch |
| +1 | +1 | −1 | Phase C, bottom switch |

It can therefore be seen from Table 2 that the location of an open switch fault can be determined based upon the sign of the first portions fault signatures in the second derivative of each phase of the three-phase current. In particular, where the first portion of the fault signature of one phase has a positive sign, and the first portions of the fault signatures of the remaining two phases have negative signs, then the fault is a top switch fault in the phase which has a first portion of a fault signature having a positive sign. Where the first portion of a fault signature of one phase has a negative sign, and the first portions of the fault signatures of the remaining two phases have positive signs, then the fault is a bottom switch fault in the phase which has a first portion of a fault signature having a negative sign.

It is to be noted that the logic in Table 2 takes into account only the first portion of the fault signature in the second derivative, and that in order to provide more reliable fault detection it is possible to take into account the full fault signature (ie both positive and negative portions of the fault signature). It is recognised that where the first portion of the fault signature is positive, then the second portion of the fault signature will be negative, and vice versa.

The data that is passed to the fault detection and identification module is compared to the data contained in logic Table 2 above, such that any open switch faults may be detected, and identified. Where no fault is identified, initial current measurements are made again, and the process is repeated.

Where a fault has been detected, and identified, a digital signal, in the form of a visual indicator, for example, is outputted to indicate this information. It is presently preferred that the fault indicator is a latched signal, such that once a fault has been indicated it continues to be shown.

Where there are multiple faults present in a single phase, or multiple faults present in different phases, then the fault indicator is set by the first fault that is detected. An example of a current waveform, with an open-switch 42 fault introduced between t=51 ms and t=52 ms, is shown in FIG. 6(*a*). A filtered version, the first derivative, and the second derivative, of the current waveform of FIG. 6(*a*), are shown in FIGS. 6(*b*)-(*d*) respectively. Corresponding enlarged versions of the region of open-switch fault 42 occurrence in FIGS. 6(*a*)-(*d*) are shown in FIGS. 7(*a*)-(*d*).

As can be seen from FIG. 7(*b*), the occurrence of an open-switch fault 42 causes a change in the filtered current waveform. By comparison with FIG. 7(*a*) it will be seen that the open-switch fault 42 is more difficult to detect in an unfiltered signal. From FIG. 7(*c*), it can be seen that the occurrence of the open-switch fault 42 causes a spike in the first derivative of the current waveform, whilst from FIG. 7(*d*), it can be seen that the occurrence of the open-switch fault 42 causes a characteristic fault signature in the second derivative of the current waveform, with the fault signature having positive and negative first and second portions, or vice versa.

FIGS. 8(*a*)-(*c*) show examples of the second derivative of an A-phase current waveform, a B-phase current waveform, and a C-phase current waveform, respectively. In each of FIGS. 8(*a*)-(*c*), a fault signature indicative of open-switch fault occurs in the region between t=51 ms and t=52 ms. This open-switch fault region is shown in enlarged form in FIGS. 9(*a*)-(*c*).

Figure 9A:
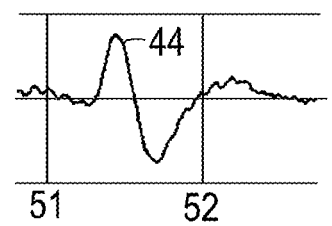
FIGS. 9(a)-9(c) are enlarged views of the region of open-switch fault introduction of FIGS. 8(a)-8(c)
Figure 9B:
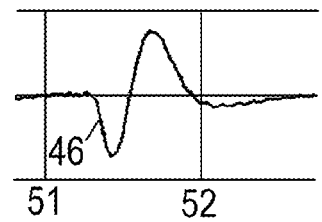
Figure 9C:
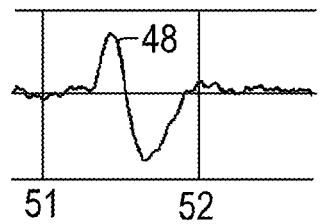

As can be seen FIGS. 9(*a*)-(*c*), the fault signature in the second derivative of the A-phase current has a positive first portion 44, the fault signature in the second derivative of the B-phase current has a negative first portion 46, and the fault signature in the second derivative of the C-phase current has a positive first portion 48. As there is a fault signature in each of the second derivatives of the three-phase currents, this is indicative of an open-switch fault, as previously discussed. Using the logic contained in Table 2, it can be seen that the open-switch fault indicated by FIGS. 9(*a*)-(*c*) occurs in the bottom switch of the B-phase.

Thus the second derivatives of the three-phase currents can be used to detect and identify open-switch faults in a two-level voltage source inverter.

Figure 10:
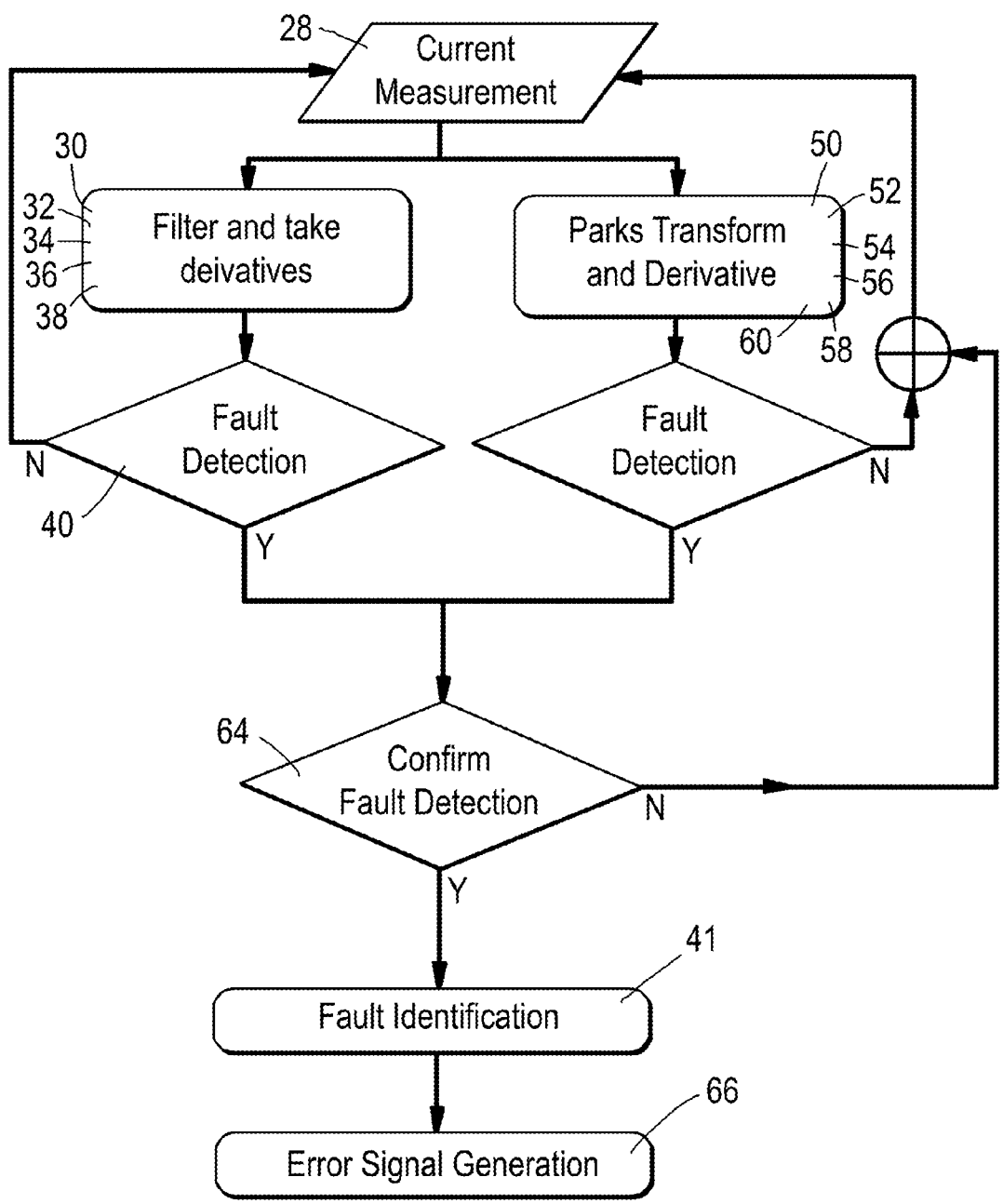
FIG. 10 is a flow chart of a fault detection and identification method according to a third embodiment of the present disclosure.
Figure 11:
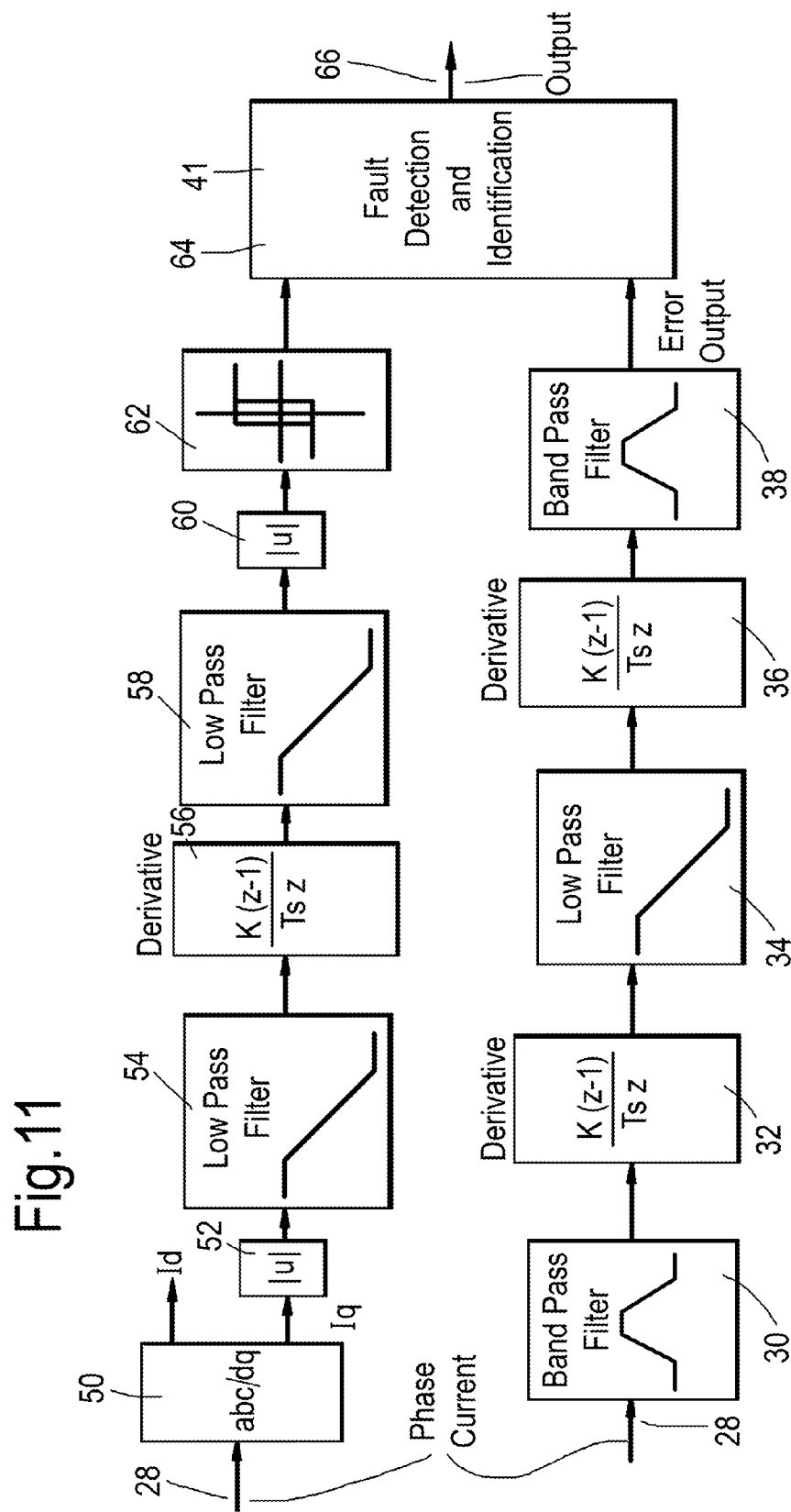
FIG. 11 is a block diagram of an example of a system for implementing the fault detection and identification method of FIG. 10.

A third embodiment of the method of fault detection and identification for a two-level voltage source inverter attached to a load according to the present disclosure is described with reference to FIGS. 10 and 11.

The third embodiment of the present disclosure utilises the second embodiment of the present disclosure in combination with a further fault detection technique, which may allow for more robust and reliable fault detection. In particular, the third embodiment of the present disclosure may eliminate false fault detection which may occur as a result of harmonics of the three-phase current waveforms.

The further fault detection technique contains the following steps. Initially each component of the three-phase (denoted phase A, phase B, and phase C) current outputted by the inverter ($I_A$, $I_B$, $I_C$) is measured 28 using current sensors attached to each phase The three-phase current is converted to q and d axis current 50 via a DQO transformation (i.e. a transformation to the synchronous reference frame which converts three-phase AC quantities to DC quantities), and the modulus of the q-axis current is taken 52. The q-axis current is then passed through a low pass filter 54 which has a cut off frequency that is lower than the switching frequency of the inverter, and the derivative of the filtered signal is taken 56. The derivative is passed through a low pass filter 58 which has a cut off frequency that is lower than the switching frequency of the inverter, and the modulus of the filtered signal is taken 60. This filtered signal is used to detect whether a fault has occurred 62. In particular, the filtered signal comprises a spike, which when compared to a pre-determined threshold value allows a fault to be detected. The fault signature uniquely distinguishes an open switch fault from transients in the load via use of the second time derivative.

If both the further fault detection technique and the method of the second embodiment of the present disclosure detect a fault, then a fault is confirmed 64, and the logic of Table 2 is used to identify the fault 41, resulting in an error signal being generated 66.

Whilst the specific embodiments described above relate to an inverter, from an operational point of view an active rectifier and an inverter work in a similar way. The major difference is the direction of the flow of power, and this is also reflected in the current, particularly the direction of the current changes. For the control of both an inverter and a rectifier, it is necessary to measure currents in the AC side, and hence the skilled person will understand that the method of the present disclosure, and the embodiments of the disclosure described above are applicable to both inverters and controlled rectifiers.

In particular, the alternating current contains the fault signature that is sought according to the method of the present disclosure (ie time derivative). Thus, irrespective of whether the power converter is an inverter or an active rectifier, it is possible to extract the fault signature using the method of the present disclosure, without the need for any substantial or non-routine hardware or software change. It is not necessary to measure DC side current, or take it's derivative, for the method of the present disclosure, although such readings may be taken for additional fault detection or verification purposes.

What is claimed is:

1. A method of open-switch fault detection in a two-level voltage source power converter, the method comprising:
   i. acquiring the waveforms of three-phase alternating current of the two-level voltage source power converter;
   ii. calculating at least a first time derivative of each acquired waveform; and
   iii. using the at least first time derivative to determine whether an open-switch fault is present in the two-level voltage source power converter, the at least first time derivative comprises a second time derivative of one or more waveform used to determine whether an open-switch fault is present in the two-level voltage source power converter, and wherein the location of an open-switch fault is determined when at least a portion of an identified fault signature in a calculated second time derivative of one phase has a first sign, and at least a portion of identified fault signatures in the calculated second time derivatives of the remaining phases have a second sign, the second sign being different to the first sign.

2. The method as claimed in claim 1, wherein the power converter is a two-level voltage source power inverter or a two-level voltage source active rectifier.

3. The method as claimed in claim 1, comprising using the calculated time derivatives to identify the location of the open-switch fault.

4. The method as claimed in claim 1, comprising filtering the acquired waveforms using a low-pass filter prior to, or after calculating at least the at least first time derivative of each acquired waveform.

5. The method as claimed in claim 1, wherein the presence of an open-switch fault is determined when the sum of the at least first time derivatives of each acquired waveform is equal to zero.

6. The method as claimed in claim 1, wherein the presence of an open-switch fault is determined when the at least first time derivatives of two of the phases of the three-phase alternating current are equal and opposite in magnitude.

7. The method as claimed in claim 1, wherein the presence of an open-switch fault is determined only when a load driven by the power converter is at a non-zero speed.

8. The method as claimed in claim 1, comprising outputting a latched signal indicative of an open switch fault.

9. The method as claimed in claim 1, comprising using a calculated second time derivative of one or more waveform to verify the presence of an open switch-fault and/or to identify the location of the open-switch fault.

10. The method as claimed in claim 1, comprising filtering the waveforms after calculating the second time derivative using a band pass filter.

11. The method as claimed in claim 1, comprising filtering the acquired waveforms after calculating the first time derivative, and prior to calculating the second time derivative.

12. The method as claimed in claim 1, wherein the presence of an open-switch fault is determined based on identified fault signatures in second time derivatives calculated for each acquired waveform.

13. The method as claimed in claim 11, wherein the location of an open-switch fault is determined based on the sign of at least a portion of the identified fault signatures in the calculated second time derivatives.

14. The method as claimed in claim 1, comprising an additional open-switch fault detection process to confirm the presence of an open-switch fault, wherein the additional open-switch fault detection process utilises the q-axis current of the three-phase current.

15. A data carrier comprising machine readable instructions for operation of one or more processor to perform the method of claim 1.

* * * * *